(12) United States Patent
Sidiropoulos (10) Patent No.: US 8,428,210 B2
(45) Date of Patent: Apr. 23, 2013

(54) APPARATUS AND METHOD FOR CONTROLLING A MASTER/SLAVE SYSTEM VIA MASTER DEVICE SYNCHRONIZATION

(75) Inventor: Stefanos Sidiropoulos, Palo Alto, CA (US)

(73) Assignee: Rambus Inc., Sunnyvale, CA (US)

( * ) Notice: Subject to any disclaimer, the term of this patent is extended or adjusted under 35 U.S.C. 154(b) by 301 days.

(21) Appl. No.: 12/705,524

(22) Filed: Feb. 12, 2010

(65) Prior Publication Data

US 2010/0146172 A1 Jun. 10, 2010

Related U.S. Application Data

(63) Continuation of application No. 12/205,350, filed on Sep. 5, 2008, now Pat. No. 7,702,057, which is a continuation of application No. 10/963,828, filed on Oct. 11, 2004, now Pat. No. 7,466,784, which is a continuation of application No. 09/353,547, filed on Jul. 14, 1999, now Pat. No. 6,839,393.

(51) Int. Cl.
H04L 7/00 (2006.01)

(52) U.S. Cl.
USPC .......................................................... 375/371

(58) Field of Classification Search .................. 375/371, 375/354, 358, 226
See application file for complete search history.

(56) References Cited

U.S. PATENT DOCUMENTS

| 4,481,625 A | 11/1984 | Roberts et al. ................... 370/85 |
| 5,097,489 A | 3/1992 | Tucci ............................. 375/120 |
| 5,432,823 A | 7/1995 | Gasbarro et al. ............... 375/107 |
| 5,485,490 A | 1/1996 | Leung et al. ................... 375/118 |
| 5,513,327 A | 4/1996 | Farmwald et al. ............. 395/309 |
| 5,554,945 A | 9/1996 | Lee et al. ....................... 327/105 |
| 5,577,236 A | 11/1996 | Johnson et al. ................ 713/400 |
| 5,579,352 A | 11/1996 | Llewellyn ...................... 375/376 |
| 5,614,855 A | 3/1997 | Lee et al. ....................... 337/158 |
| 5,615,358 A | 3/1997 | Vogley .......................... 713/501 |
| 5,692,165 A | 11/1997 | Jeddeloh et al. |
| 5,757,786 A | 5/1998 | Joo |
| 5,852,640 A | 12/1998 | Kliza et al. .................... 375/356 |

(Continued)

FOREIGN PATENT DOCUMENTS

| JP | 63276935 | 11/1988 |
| JP | 387907 | 4/1991 |
| JP | 4117709 | 4/1992 |

OTHER PUBLICATIONS

Chang, K.Y., "Design of a CMOS Asymmetric Serial Link," Ph.D. Dissertation, Stanford University, Aug. 1999.

(Continued)

*Primary Examiner* — Kevin Kim
(74) *Attorney, Agent, or Firm* — Morgan, Lewis & Bockius LLP (57) ABSTRACT

A method of operating a master/slave system includes the step of identifying a master receive data phase value to coordinate the transfer of data from a slave device without phase alignment circuitry to a master device with a universal phase aligner. Data is transferred from the slave device to the master device in accordance with the master receive data phase value. The master device characterizes a master transmit data phase value to coordinate the transfer of data from the master device to the slave device. Subsequently, the master device routes data to the slave device in accordance with the master transmit data phase value.

19 Claims, 5 Drawing Sheets

U.S. PATENT DOCUMENTS

| | | | | |
|---|---|---|---|---|
| 5,864,592 | A | 1/1999 | Itri | 375/375 |
| 5,889,824 | A | 3/1999 | Ueda | 375/344 |
| 5,896,347 | A | 4/1999 | Tomita et al. | 365/233 |
| 5,918,040 | A | 6/1999 | Jarvis | 395/553 |
| 5,933,623 | A | 8/1999 | Umemura et al. | 395/551 |
| 6,016,282 | A | 1/2000 | Keeth | 365/233 |
| 6,043,694 | A | 3/2000 | Dortu | 327/156 |
| 6,125,419 | A | 9/2000 | Umemura et al. | 710/110 |
| 6,131,149 | A | 10/2000 | Lu et al. | 711/167 |
| 6,232,806 | B1 | 5/2001 | Woeste et al. | 327/149 |
| 6,236,623 | B1 | 5/2001 | Read et al. | 368/46 |
| 6,292,903 | B1 | 9/2001 | Coteus et al. | 711/401 |
| 6,426,984 | B1 | 7/2002 | Perino et al. | 375/356 |
| 6,510,503 | B2 | 1/2003 | Gillingham et al. | 711/104 |
| 6,513,103 | B1 | 1/2003 | Garlepp et al. | 711/167 |
| 6,553,472 | B2 | 4/2003 | Yang et al. | 711/167 |
| 6,560,674 | B1 * | 5/2003 | Hosogi et al. | 711/118 |
| 6,611,905 | B1 | 8/2003 | Grundon et al. | 711/167 |
| 6,804,764 | B2 | 10/2004 | LaBerge et al. | 711/170 |
| 6,807,614 | B2 | 10/2004 | Chung | 711/168 |
| 6,928,571 | B1 | 8/2005 | Bonella et al. | 713/401 |
| 6,970,988 | B1 | 11/2005 | Chung | 711/168 |
| 7,061,821 | B2 | 6/2006 | Coteus et al. | 365/230.01 |
| 7,076,745 | B2 | 7/2006 | Togo | |
| 7,100,066 | B2 | 8/2006 | Jeong | 713/500 |
| 7,224,595 | B2 | 5/2007 | Dreps et al. | 365/63 |
| 2001/0013802 | A1 | 8/2001 | Faulcon et al. | 327/244 |
| 2001/0047450 | A1 | 11/2001 | Gillingham et al. | 711/105 |
| 2002/0181633 | A1 | 12/2002 | Trans | 375/354 |
| 2006/0244505 | A1 | 11/2006 | Fung et al. | 327/293 |

OTHER PUBLICATIONS

Chang, et al., "A 2Gb/s/pin CMOS Asymmetric Serial Link," 1998 Symposium on VLSI Circuits Digest of Technical Papers.

Sidiropoulos, S., "A Semidigital Dual Delay/Locked Loop," IEEE J. Solid State Circuits, vol. 32, No. 11, Nov. 1997.

* cited by examiner

APPARATUS AND METHOD FOR CONTROLLING A MASTER/SLAVE SYSTEM VIA MASTER DEVICE SYNCHRONIZATION

CROSS REFERENCE TO RELATED APPLICATION

This is a continuation of U.S. application Ser. No. 12/205,350, filed Sep. 5, 2008, now U.S. Pat. No. 7,702,052, issued Apr. 20, 2010, which is a continuation of U.S. application Ser. No. 10/963,828, filed Oct. 11, 2004, now U.S. Pat. No. 7,466,784, issued Dec. 16, 2008, which is a continuation of U.S. application Ser. No. 09/353,547 filed Jul. 14, 1999, now U.S. Pat. No. 6,839,393, issued Jan. 4, 2005, all of which are incorporated herein by reference.

BRIEF DESCRIPTION OF THE INVENTION

This invention relates generally to master/slave digital systems. More particularly, this invention relates to a master/slave digital system in which the master device performs all synchronization operations, thereby obviating the need for phase alignment circuitry on slave devices.

BACKGROUND OF THE INVENTION

Synchronous bus systems have been developed to support higher bandwidth digital systems. In a synchronous bus system, data packets are sent between a master device and one or more slave memory devices. The data packets travel in parallel with a system clock and maintain a precise phase to that clock. Typically, synchronous memory systems utilize a phase adjusting circuit on the master and on each one of the slave devices in order to align the on-chip receive and transmit clocks to maximize the reception timing margins both on the master and slave devices. U.S. Pat. Nos. 5,432,823 and 5,513,327, which are assigned to the assignee of the present invention and which are expressly incorporated by reference herein, describe synchronous memory systems with phase adjusting circuitry on both master and slave devices.

The primary disadvantage of using phase alignment circuitry in every slave device of a master/slave system is that it increases power dissipation. For example, if the "standby" power of phase alignment circuitry, such as a Delay Locked Loop, is 125 mW, a system with 32 slave devices on standby mode will dissipate a total of 4 W. This power dissipation is prohibitively large for emerging portable applications.

In view of the foregoing, it would be highly desirable to provide a master/slave system in which the slave devices do not require phase alignment circuitry, thereby allowing the master/slave system to operate with substantially reduced power dissipation.

SUMMARY OF THE INVENTION

A method of operating a master/slave system includes the step of identifying a master receive data phase value to coordinate the transfer of data from a slave device without phase alignment circuitry to a master device with a universal phase aligner. Data is transferred from the slave device to the master device in accordance with the master receive data phase value. The master device characterizes a master transmit data phase value to coordinate the transfer of data from the master device to the slave device. Subsequently, the master device routes data to the slave device in accordance with the master transmit data phase value.

A master/slave system includes a set of slave devices, with each slave device having a clock circuit without phase alignment circuitry. A master device with a universal phase alignment circuit includes a phase value register bank storing a set of phase values for the set of slave devices. The master device utilizes a selected phase value of the set of phase values to alter a system clock signal in accordance with the selected phase value so as to establish synchronous communication between the master device and a selected slave device of the set of slave devices.

The invention provides a master/slave system in which the slave devices do not require phase alignment circuitry. Thus, the master/slave system operates with substantially reduced power dissipation. The apparatus of the invention can be operated in a high throughput mode wherein each slave device is assigned a first phase delay value for data transmission and a second phase delay value for data reception. In a simpler, lower throughput mode, individual phase delay values are not stored. Instead, the master designates different slave devices to process different data edges, depending upon the phase information the master device receives during a calibration operation.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE INVENTION

Figure 1:
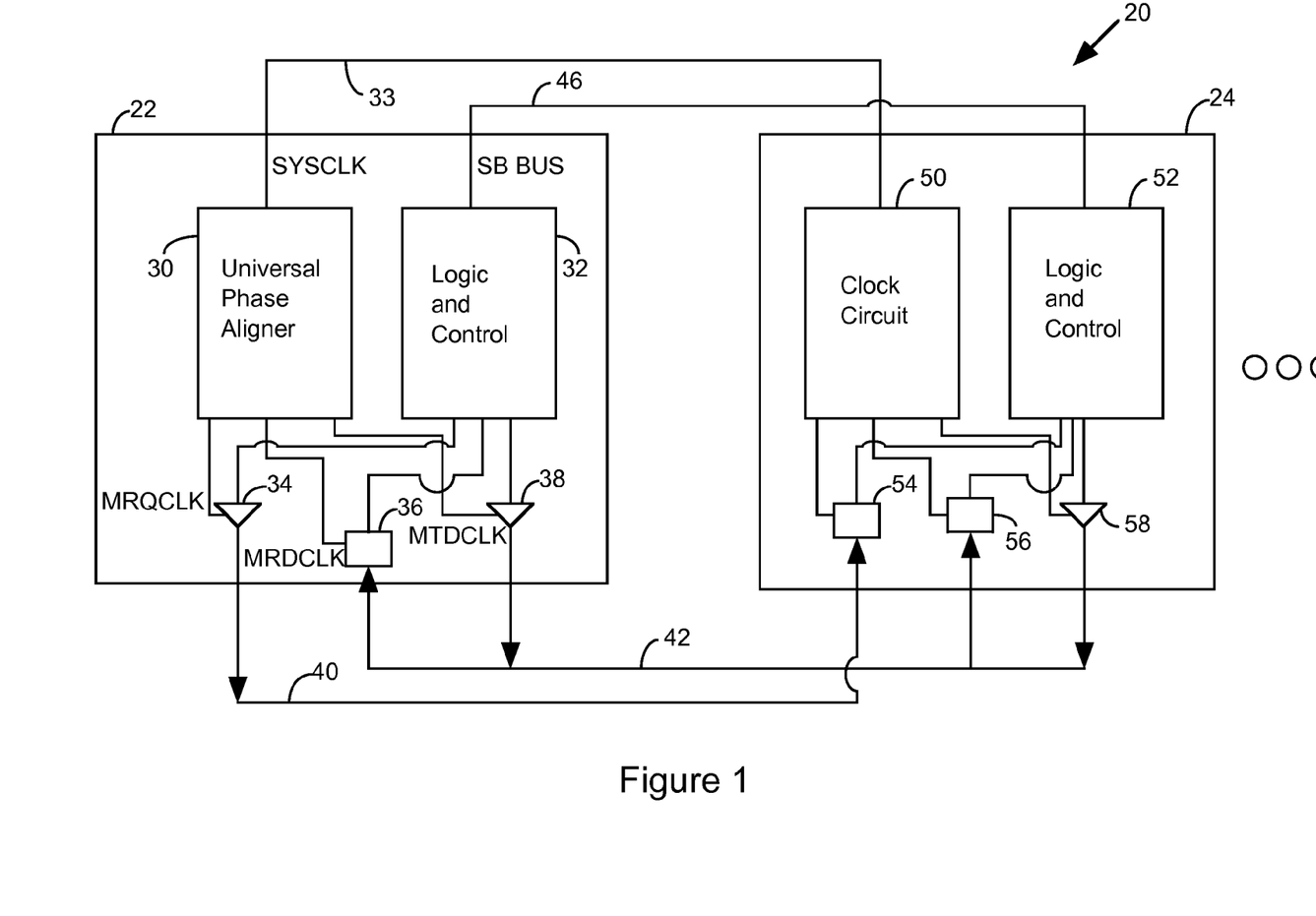
FIG. 1 illustrates a master/slave system constructed in accordance with an embodiment of the invention.

FIG. 1 illustrates a master/slave system 20 constructed in accordance with an embodiment of the invention. The system 20 includes a master device 22 and a set of slave devices 24. FIG. 1 illustrates a single slave device 24 for the purpose of simplicity. However, it should be appreciated that the system 20 includes many slave devices 24, each of which is configured as the device shown in FIG. 1. The master device 22 includes a universal phase aligner 30, which operates to coordinate the phase alignment in all communications between the master device 22 and the slave devices 24. In other words, the universal phase aligner 30 obviates the need for phase alignment circuitry in each of the slave devices 24. In the absence of phase alignment circuitry in each of the slave devices 24, the master/slave system 20 dissipates a relatively small amount of power.

FIG. 1 illustrates that the master device 22 includes logic and control circuitry 32. The operation and implementation of the logic and control circuitry 32 is independent of the invention, since the universal phase aligner 30 may be used with practically any type of logic and control circuitry 32.

In the embodiment of FIG. 1, the universal phase aligner 30 produces a system clock (SYSCLK) on line 33. In an alternate embodiment, the system clock on line 33 is generated by a separate clock source that is external to the universal phase aligner 30. The universal phase aligner 30 also produces a master request clock (MRQCLK) signal, which controls the timing of an output buffer 34. The output buffer 34 receives slave access request control and data signals from the logic and control circuitry 32. The output buffer 34 applies the signals to a request bus 40. An output buffer 34 is provided for each line of the request bus 40.

The universal phase aligner 30 also produces a master receive data clock (MRDCLK) signal, which is used to control a latch 36, which may be a flip-flop. The latch 36 latches data from the data bus 42. The data bus 42 carries data to and from the master device 22 (i.e., the data bus 42 is bi-directional). A latch is provided for each line of the data bus 42.

As discussed below, the MRDCLK signal is a phase adjusted system clock signal for a selected slave device 24. The MRDCLK signal is synchronized to data received from the selected slave device of the master/slave system 20. The MRDCLK signal accounts for the time between when the system clock is used to launch data from a slave device 24 and the time that the data is received at the master device. By accounting for this time difference, expressed as a phase difference between the system clock and the MRDCLK, the slave device 24 and the master device 22 can exchange data in phase.

The universal phase aligner 30 also produces a master transmit data clock (MTDCLK) signal, which controls the timing of an output buffer 38. The output buffer 38 drives data from the logic and control circuitry 32 onto the data bus 42. An output buffer 38 is provided for each line of the data bus 42.

As discussed below, the MTDCLK signal is a phase adjusted system clock signal for a selected slave device 24. The MTDCLK signal is synchronized to transmit data, such that the selected slave device of the master/slave system 20 receives the data in phase with the system clock. The MTDCLK signal accounts for the time between launching data from the master 22 to the time that it is received at the slave 24. This time difference, expressed as a phase difference between the system clock and the MTDCLK, allows the master device 22 to launch data in a manner such that it is received at a selected slave device 24 in phase with the system clock.

FIG. 1 further illustrates a side band (SB) bus 46 connected to the logic and control circuitry 32. The side band bus 46 may be implemented as a slow bus, such as a daisy chain, which carries control signals that are not time critical.

Each slave device 24 of the master/slave system 20 includes a clock circuit 50 and a set of logic and control circuitry 52. The clock circuit 50 does not include any type of phase alignment circuitry. Instead, it is merely implemented with an amplifier, a buffer, and duty cycle correction circuitry, if necessary. The amplifier and buffer may be used to amplify and buffer the system clock (SYSCLK) received from line 33. The amplified and buffered system clock (SCLKO) is used to gate a request bus flip-flop 54, a data bus input flip-flop 56, and a data bus output buffer 58. The request bus flip-flop 54 is attached to the request bus 40, while the data bus input flip-flop 56 and the data bus output buffer 58 are connected to the data bus 42. Flip-flops 56 and output buffers 58 are provided for each line of the request bus 40 and data bus 42. The implementation of the logic and control circuitry 52 is inapposite to the invention, as a variety of logic and control functions may be implemented in accordance with the synchronization scheme of the invention.

Figure 2:
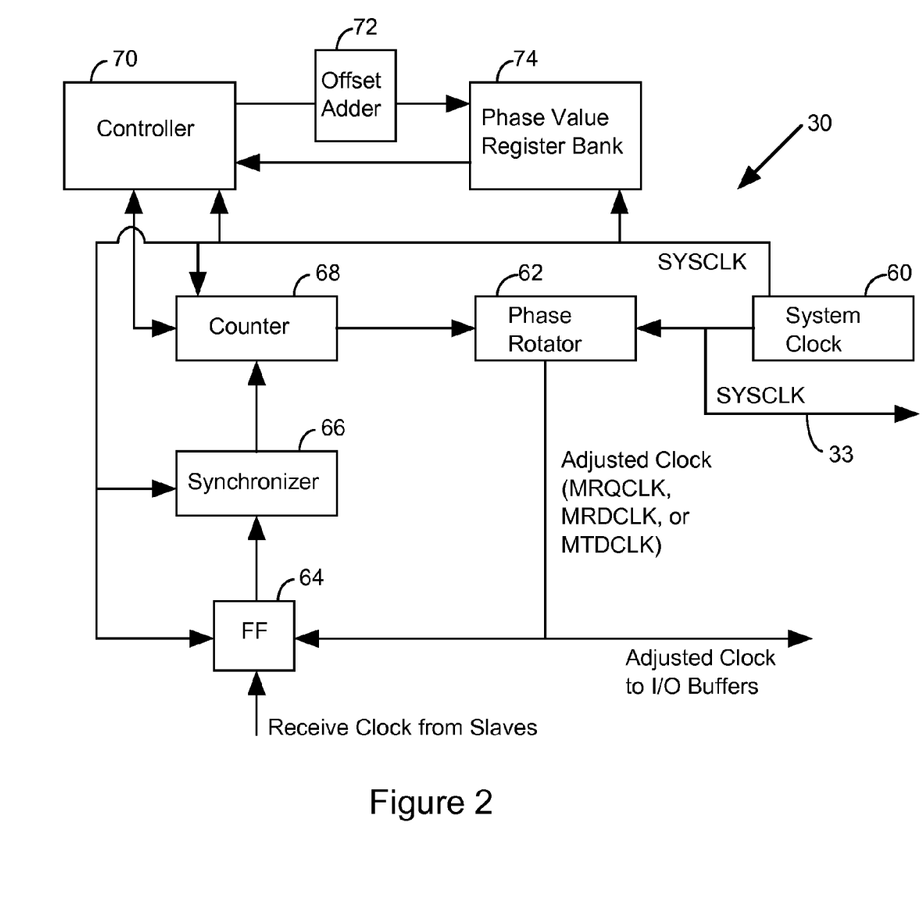
FIG. 2 illustrates a universal phase aligner, in accordance with an embodiment of the invention, for use in the system of FIG. 1.

The operations performed by the components of FIG. 1 are more fully appreciated with reference to FIG. 2, which illustrates a universal phase aligner 30 constructed in accordance with an embodiment of the invention.

The universal phase aligner 30 may include a standard system clock source 60. Alternately, an external system clock may be used. The system clock signal (SYSCLK) is applied to line 33 of FIG. 1 and to a phase rotator 62. As its name implies, the phase rotator 62 operates to rotate the phase of the system clock (SYSCLK) in accordance with a value specified by a phase error signal. The phase rotator 62 may be implemented with a phase-locked loop, a delayed lock loop, or equivalent device known to those skilled in the art.

The output of the phase rotator 62 is an adjusted system clock signal, which may be the previously described master request clock (MRQCLK), master receive data clock (MRDCLK), or the master transmit data clock (MTDCLK). The adjusted system clock signal is applied to a flip-flop 64, which also receives a clock signal from a selected slave device. In particular, a signal is received at latch 36 of FIG. 1. A synchronizer 66 operates to stabilize the output from the flip-flop 64. The synchronizer 66 may be implemented as a series of flip-flops.

A counter 68 is used to quantify the phase difference between the adjusted clock signal and the clock signal received from the selected slave device. For example, the counter 68 may be implemented to count digital values read from the flip-flop 64. In such an embodiment, the flip-flop 64 may be timed by a digital high adjusted clock signal. A digital high output from the flip-flop 64 indicates that the clock signal from the slave device is at a digital high value at the same time as the adjusted clock signal. Thus, the signal from the slave device has arrived at the flip-flop 64. On the other hand, a low output from the flip-flop 64 indicates that the clock signal from the slave device has not been received at the flip-flop 64. In such a case, the counter is incremented to adjust for the phase error. When phase alignment is achieved, the counter 68 stores a counter value indicating the phase difference between the adjusted clock signal and the clock signal received from the selected slave device.

At this time, a controller 70 reads the counter value in the counter 68. The phase difference value read from the counter is then stored in a phase value register bank 74. In particular, the phase difference value is stored in a register corresponding to the selected slave device. Recall that the stored value specifies a phase value adjustment to the system clock that will match the clock signal received from the selected slave device to the adjusted clock signal. Since the signals are matched, each signal transition will occur at the same time. This may result in metastability problems as the signals are latched into different devices. To avoid this problem, an offset adder 72 is used to add an offset value to the phase value received from the counter 68. The offset improves data reception timing margins. By way of example, the offset may be 90 degrees.

Later when the master 22 communicates with a selected slave device 24, the phase value for the selected slave device is retrieved by the controller 70 from the phase value register bank 74. The controller 70 then loads the value into the counter 68 and disables the counter. Thus, the same phase value is applied to the phase rotator 62 with every clock cycle. This results in a phase rotation of the system clock (SYSCLK) to correspond to the specified phase value.

Each of the components of FIG. 2 has now been described. Attention presently turns to a more detailed discussion of the operation of the components of FIG. 2 in the context of the system of FIG. 1.

As previously indicated, the master/slave system of FIG. 1 does not include clock phase alignment circuitry in the slave devices 24. Instead, all clock phase alignment is performed by the master device 22 for each slave device in the system 20. The master device 22 initially performs two calibration operations: a master data receive calibration and a master transmit data calibration. The master data receive calibration operation is performed to identify the phase value to be used for receiving data from a selected slave device. The phase value obtained from the master data receive calibration is used during a master data receive operation. More particularly, the phase value is used to adjust the system clock so that a receiver of the master device 22, operating in response to the adjusted system clock, receives data in phase from a selected slave device, which is operating in response to the system clock.

The master transmit data calibration operation is performed to identify the phase value to be used to transmit data to a selected slave device. The phase value secured during the master transmit data calibration operation is used during a master transmit data operation. That is, the phase value is used to adjust the system clock so that an output buffer of the master device 22, operating in response to the adjusted system clock, transmit data that is in phase with the system clock as received at the selected slave device.

Figure 3:
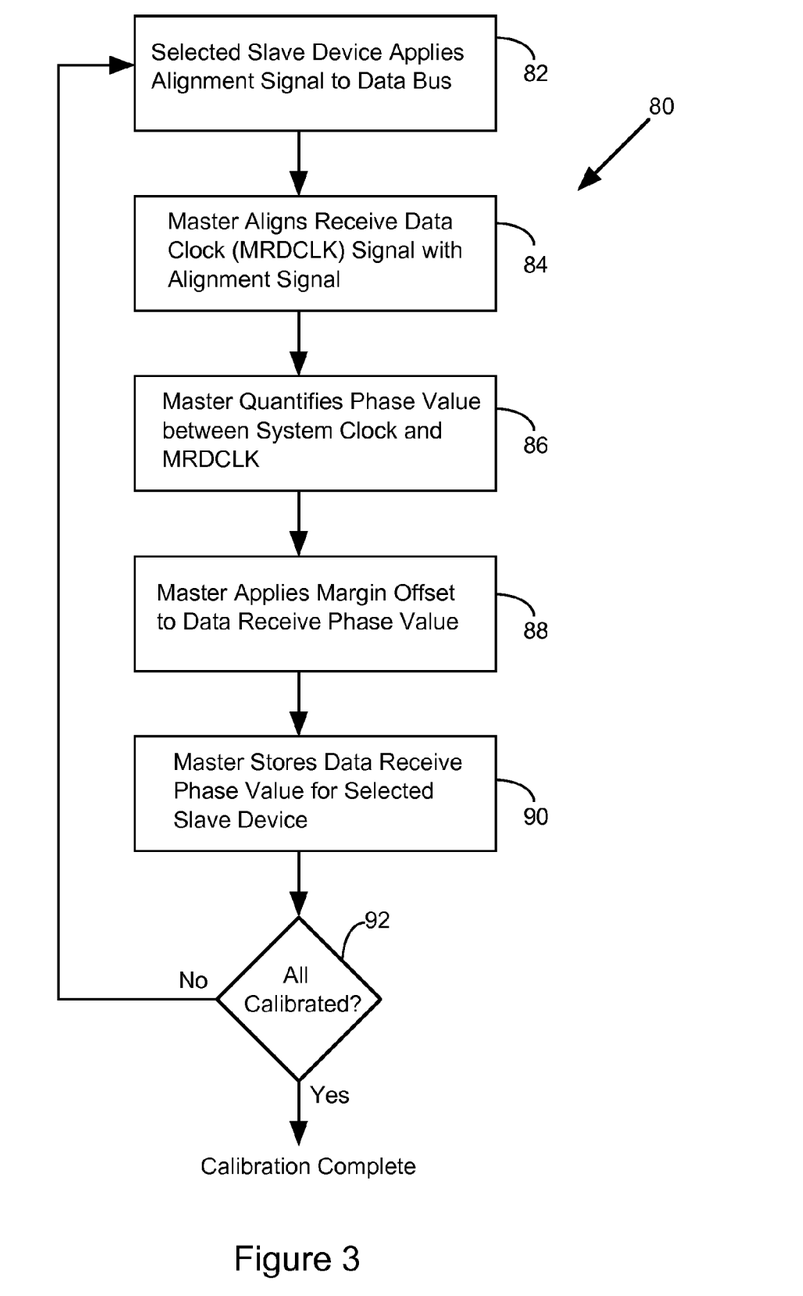
FIG. 3 illustrates a master receive data calibration method executed in accordance with an embodiment of the invention.

The master data receive calibration operation 80 is disclosed in connection with FIG. 3. Initially, a selected slave device applies an alignment signal to the data bus (step 82). This step may be initiated by a command on the side band bus 46. Thus, for example, the logic and control circuitry 32 of the master device 22, may apply a signal to the side band bus 46, which causes the selected slave device 24 to generate a periodic signal that is applied to the data bus 42. By way of example, the periodic signal may be a sequence of on and off digital pulses (i.e., a clock signal) generated by the logic and control circuitry 52 and applied to the bus 42 via buffer 58. The master device 22 receives these signals at latch 36. Latch 36 is controlled by the clock signal MRDCLK. Initially, the MRDCLK signal is simply the system clock SYSCLK (the phase rotator 62 has not applied a phase error to the system clock). The universal phase aligner 30 subsequently aligns the MRDCLK signal with the alignment signal received from the selected slave device (step 84). As previously discussed, the counter 68 quantifies the phase error between the MRDCLK signal and the alignment signal. When alignment is achieved, the counter 68 holds the phase value that achieved alignment. Thus, the next processing step can be characterized as the master quantifying the phase value between the system clock and the MRDCLK clock (step 86).

The next processing step of FIG. 3 is to have the master apply a margin offset to the phase value (step 88). As discussed in connection with FIG. 2, an offset adder 72 is used to add an offset to the phase value to improve the processing margin and thereby avoid metastability problems. The final processing step shown in FIG. 3 is to have the master store the receive phase value for the selected slave device (step 90). In other words, the phase value determined by the calibration operation 80 is stored in a register of the phase value register bank 74, the selected register corresponding to the slave device that was just calibrated.

A decision is then made to determine whether all of the slave devices have been calibrated (step 92). If not, a calibration operation for the next slave device in the system is initiated with step 82. Once all of the slave devices in the system have been calibrated to obtain a data receive phase value, the calibration operation 80 is completed.

Figure 4:
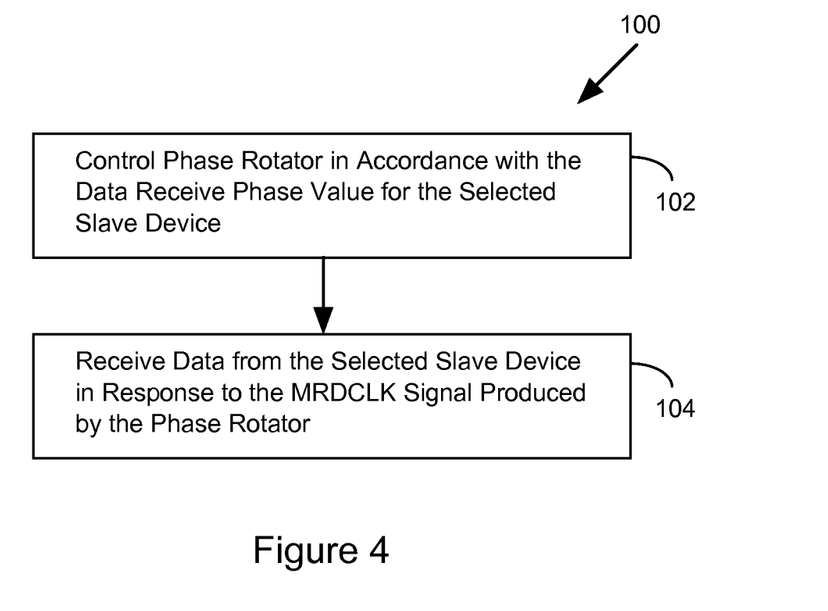
FIG. 4 illustrates a master receive data operation executed in accordance with an embodiment of the invention.

FIG. 4 illustrates a master data receive operation 100 in accordance with an embodiment of the invention. If the master device 22 is to receive data from a selected slave device, then the controller 70 retrieves the phase value for the selected slave device from the phase value register bank 74. The controller 70 then passes the phase value to the counter 68 and disables the counter. As a result, the counter continuously applies the established data receive phase value to the phase rotator 62. Accordingly, the phase rotator 62 rotates the system clock (SYSCLK) to produce a phase adjusted MRDCLK signal that is appropriately aligned (with offset) with the incoming data from the selected slave device. These operations can be summarized with the processing steps shown in FIG. 4. In particular, a first step entails controlling the phase rotator 62 in accordance with the data receive phase value for the selected slave device (step 102), and a second step of receiving data from the selected slave device in response to the MRDCLK signal produced by the phase aligner (step 104).

Figure 5:
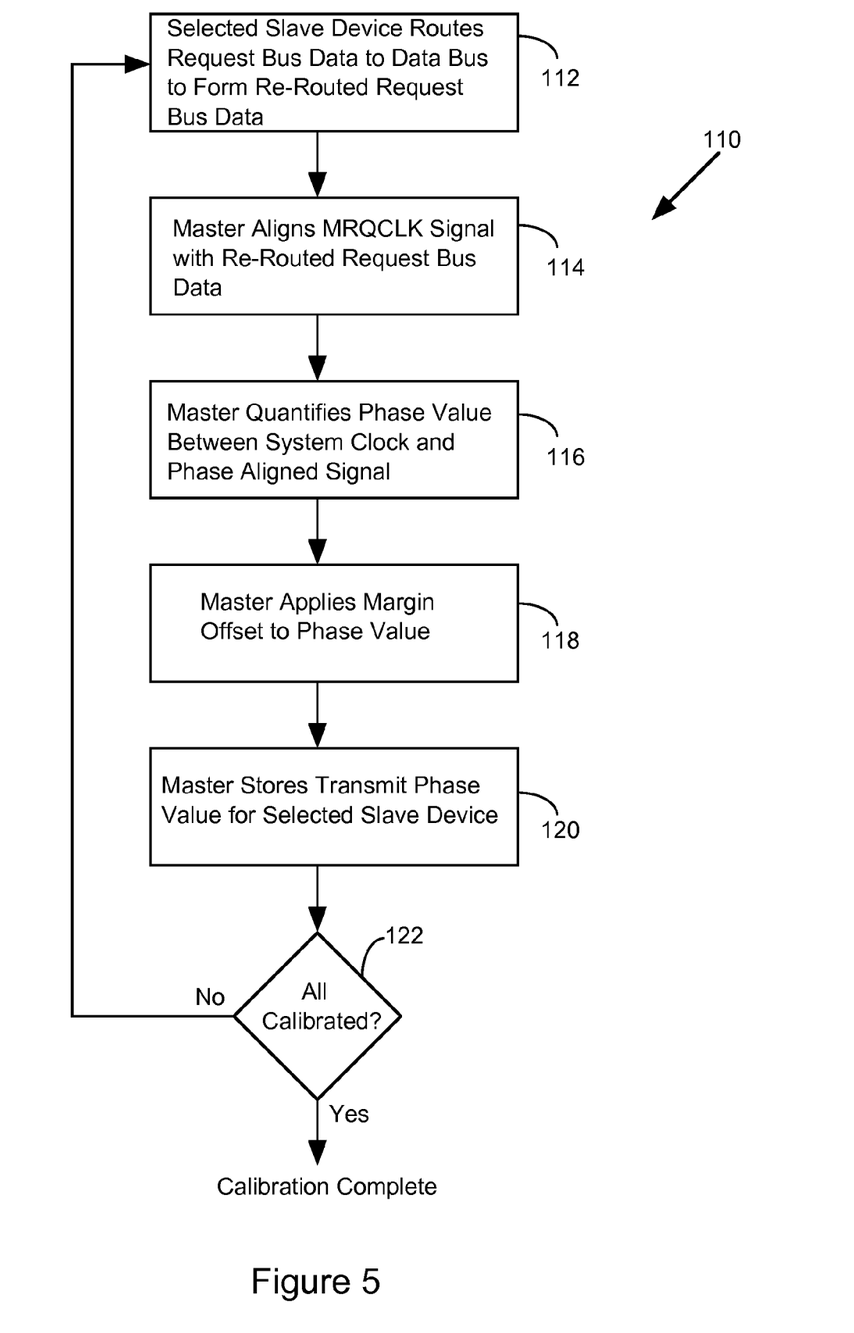
FIG. 5 illustrates a master transmit data calibration method executed in accordance with an embodiment of the invention.

The master transmit data calibration operation 110 of the invention is disclosed in connection with FIG. 5. The first processing step of FIG. 5 is to have a selected slave device 24 route request bus data to the data bus 42 as re-routed request bus data (step 112). That is, the master device 22 advises the slave device 24, for example via a signal on the side band bus 46, to re-route request bus data in the form of a set of digital high and low signals forming a clock signal. The logic and control circuitry 52 of the slave device 24 then re-routes the data from the latch 54 to the buffer 58.

The master device 22 then aligns the master request clock (MRQCLK) until it corresponds to the re-routed request bus data at the slave device 24. Observe that in this case, the phase difference created by the distance on the data bus 42 from the selected slave device 24 to the master device 22 is accounted for by the data receive phase value for the selected slave device, which was obtained during the master data receive calibration. Thus, the present calibration operation measures the phase difference created by data traveling from the master device 22 to the selected slave device 24. That is, the present calibration operation measures the phase difference created by data traveling on the request bus 40 between the master device 22 and the selected slave device 24.

In sum, the master device 22 aligns the MRQCLK signal with the re-routed request bus data to form a master transmit phase aligned MRQCLK signal for the selected slave device (step 114). As previously discussed in connection with FIG. 2, the value in the counter 68 is adjusted until the a phase error signal from the counter allows the phase rotator 62 to phase rotate the system clock (SYSCLK) until it is in phase with the re-routed request bus data.

After alignment is achieved, the master has quantified the phase value between the system clock and the master transmit phase aligned MRQCLK signal (step 116). The master then applies a margin offset to the phase value (step 118). As previously discussed, this is performed by the offset adder 72 to improve timing margins. The master then stores the offset adjusted transmit data phase value for the selected slave device (step 120). If all of the slave devices have not been calibrated in this manner (step 122), then the processing of FIG. 5 is executed for the next slave device in the system. If each of the slave devices has been calibrated to obtain a transmit data phase value, then the calibration operation is complete.

Figure 6:
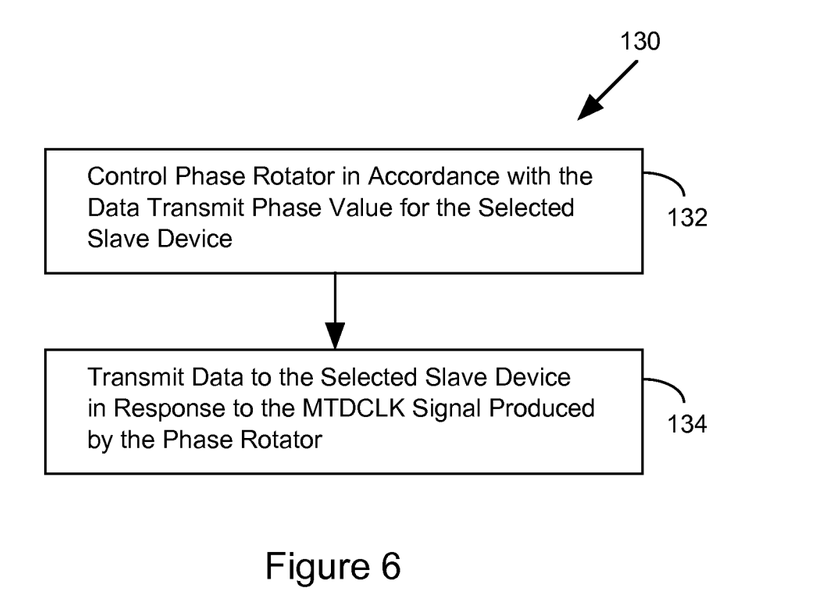
FIG. 6 illustrates a master transmit data operation executed in accordance with an embodiment of the invention.

The master transmit data operation 130 is executed in accordance with the method of FIG. 6. The phase rotator is controlled in accordance with the transmit data phase value for the selected slave device (step 132). The transmit data phase value is the phase value that produced the MRQCLK signal that was aligned with the re-routed data. The phase rotator 62 processes the transmit data phase value to produce a master transmit data clock signal (MTDCLK). Data is then transmitted to the selected slave device in response to the MTDCLK signal produced by the phase rotator (step 134).

In sum, after the master data receive calibration operation of FIG. 3 and the master transmit data calibration operation of FIG. 5 are performed, data is exchanged between the master 22 and the slave 24 according to the master data receive operation of FIG. 4 and the master transmit data operation of FIG. 6. The system needs to be re-calibrated according to the operations of FIGS. 3 and 5 periodically to compensate for drifts in operating conditions.

Attention presently turns to the master device's transfer of communication between different slave devices 24. There is a latency associated with any such transfer of control. The factors that affect hand-over or switching latency include: (1) switching the phase of the master clock to the appropriate phase for the active slave and (2) informing a slave that it is currently active or inactive. The operation of switching the phase of the master clock to the appropriate phase for the active slave can be limited to below 1-2 cycles by pipelining techniques (e.g., switching the phase of the MRQCLK before switching the MRDCLK).

There are a number of techniques that may be used to inform a slave that it is currently active or inactive. For example, a signal on the side band bus 46 may be used. While this is an acceptable solution in some systems (e.g., graphics memory subsystems), this solution might not be tolerable in systems where the master addresses different slaves frequently (e.g., main memory systems with data fragmentation).

Another technique for advising a slave device of its status is to use the request bus 40. In this embodiment, an additional "broadcast" bit is needed by the request bus 40. To accomplish an "active hand-over", the master 22 transmits a "broadcast" packet on the request bus 40. This packet is transmitted with a pre-determined phase of the MRQCLK and is valid for a full clock cycle (i.e., two bit time periods). All the inactive slaves 24 continuously sample the data on the request bus 40 with both of their negative and positive clock edges. However, they always disregard the data sampled with one of the two edges according to their local phase. In other words, depending upon the position of the slave device in the physical system, it will sample one of the two edges of the data. Thus, the slave device is effectively operating at half-frequency during this state. The decision as to which datum to process and which to disregard is made by the master and is communicated to the slave during the calibration phase. Since the broadcast bit is valid for a full clock cycle, one of the two slave clock edges is appropriate for receiving the broadcast bit and the data on the request bus 40 with adequate timing margin.

When the broadcast bit is a logical ONE, the master 22 broadcasts data on the request bus 40 specifying which slave is being invoked. Each slave 24 processes this broadcast data to determine if the broadcast data matches its specified identification value. If the comparison results in a match, the slave goes to the active mode. In the active mode, data on the request bus 40 and data bus 42 are processed at full speed (i.e., on both clock edges).

An additional consideration for the active "hand-over" is the amount of time that the slaves might have to wait before they start transmitting data on the bus so that their data will not collide with the data transmitted by the previously active slave (or reflections of that data). This amount of time depends on the electrical length of the bus.

The system of the invention can operate in a low power mode that is analogous to the active hand-over mode just discussed. In the low power mode, the phase of the master clock is pre-determined (e.g., it is locked to the system clock). Thus, the master does not change the phase of its clocks according to which slave is active. Unlike the previous high bandwidth embodiment in which two bits of data are transmitted every clock cycle, in this embodiment only one datum is transmitted per clock cycle.

During calibration for this mode, the master informs each slave which of its two clock edges to use when it receives and transmits data to and from the request bus 40 and data bus 42. The master chooses the slave transmit clock edge that produces the maximum timing margin on the master's receivers. The maximum timing margin is identified during calibration. Since the phase of the normal receive clock of the master is pre-determined and the position of the slave's clock edges can be found in the calibration period, the identification of the maximum timing margin is simply based on a digital comparison at the master device 22. Similarly, the master device 22 chooses the positive or negative edge of the slave's receive clock that results in the maximum timing margin on the slave receivers. Both the master transmit clock phase and the slave edge positions can be determined during the calibration period.

The highest peak bandwidth achievable by this system is one half of the synchronous bus system that transmits two bits of data per clock cycle. Nevertheless, its lower power consumption and simpler control scheme make this embodiment appealing for selected applications.

Those skilled in the art will recognize many alternate embodiments for the disclosed invention. For example, the invention was described in connection with a calibration technique that relied upon a clock signal. The calibration operation may also be performed with a random signal, as long as the universal phase aligner 30 can identify periodic signal edges associated with the random signal.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A method, performed by a memory controller in a memory system, comprising:
    transmitting data from the memory controller over a request bus to a memory device;
    receiving at the memory controller rerouted data transmitted over a data bus, the rerouted data comprising data rerouted by the memory device from the request bus to the data bus; and calibrating a transmission parameter of the memory system based on the rerouted data.

2. The method of claim 1, wherein the transmission parameter is a phase value used for controlling timing of transmissions of data between the memory controller and the memory device.

3. The method of claim 2, wherein the phase value is a transmit offset phase value used to time transmissions of data from the memory controller to the memory device.

4. The method of claim 2, wherein the phase value is used to time transmissions of data over the data bus.

5. The method of claim 1, wherein the transmission parameter is a delay value of the request bus associated with transmissions of data from the memory controller to the memory device over the request bus, wherein prior to the transmitting of data and the receiving of rerouted data, the method further comprises performing a receive calibration operation to configure a receiver of the memory controller to receive rerouted data transmitted over the data bus, wherein the delay value of the request bus discounts delays of the data bus determined during the receive calibration operation.

6. The method of claim 5, wherein the delay value of the request bus is stored in a register of the memory controller and is used to adjust a transmit timing of data that is transmitted from the memory controller to the memory device over the data bus.

7. A method, performed by a plurality of memory devices in a memory system, comprising:
 receiving at a respective memory device data transmitted over the request bus;
 rerouting in the memory device the data received over the request bus to a data bus output buffer as rerouted data and
 transmitting the rerouted data from the memory device over a data bus;
 the method further comprising performing the receiving, rerouting, and transmitting at each memory device in the plurality of memory devices.

8. The method of claim 7, wherein the method further comprises for a respective memory device in the plurality of memory devices:
 performing a receive calibration operation for a respective receiver of the respective memory device prior to the receiving, the rerouting, and the transmitting, to calibrate a data bus delay for the respective memory device prior to determining a respective delay value of the request bus associated with transmission of data to the respective memory device over the request bus.

9. The method of claim 8, further comprising, for at least one of the plurality of memory devices, periodically repeating the receiving, the rerouting, the transmitting, and the calibrating to compensate for drift in operating conditions of the memory system.

10. The method of claim 7, wherein the receiving, the rerouting, and the transmitting is performed to calculate a respective transmit phase value for each respective memory device in the plurality of memory devices.

11. A memory system comprising:
 a memory device, the memory device including circuitry configured to:
  selectively reroute data received over a request bus to a data bus output buffer as rerouted data and
  transmit the rerouted data over the data bus;
 wherein the memory system further comprises a plurality of memory devices; and
 wherein a respective memory device in the plurality of memory devices includes circuitry to selectively reroute respective data received over the request bus and to transmit respective rerouted data from the respective memory device over the data bus.

12. A memory controller, comprising:
 a first interface configured to couple the memory controller to a request bus, wherein the request bus is configured to carry control signals; and
 a second interface configured to couple the memory controller to a data bus, wherein the data bus is configured to carry data signals;
 wherein the memory controller includes circuitry configured to:
  transmit data over the request bus; and
  receive rerouted data from the data bus, wherein the rerouted data comprises data rerouted by a memory device from the request bus to the data bus; and
 wherein the memory controller is configured to determine at least one of a transmit phase delay value and a receive phase delay value based on the rerouted data, wherein the at least one of the transmit phase delay value and the receive phase delay value is used to align data received from the memory device with a timing signal of the memory controller.

13. The memory controller of claim 12, wherein the memory controller includes a phase alignment circuit configured to time transmissions of data over at least one of the request bus and the data bus, wherein the transmissions of data are timed based on the transmit phase delay value so that data transmitted over the data bus is aligned with a timing signal used for receiving data by the memory device.

14. The memory controller of claim 12, further comprising a drift calibration mechanism configured to periodically determine the at least one of the transmit phase delay value and the receive phase delay value to compensate for drifts in operating conditions of a memory system including the memory controller.

15. A memory controller, comprising:
 a first interface configured to couple the memory controller to a request bus, wherein the request bus is configured to carry control signals;
 a second interface configured to couple the memory controller to a data bus, wherein the data bus is configured to carry data signals; and
 a third interface configured to couple the memory controller to a side band bus;
 wherein the respective memory controller includes circuitry configured to:
  transmit data over the request bus; and
  receive rerouted data from the data bus, wherein the rerouted data comprises data rerouted by a memory device from the request bus to the data bus; and
 wherein the memory controller is configured to issue commands over the side band bus, the commands instructing the memory device to perform selective data rerouting and transmitting.

16. The memory controller of claim 12, wherein the rerouted data includes sets of high and low signals arranged so as to represent memory timing signals when received by the memory controller, and wherein the memory controller includes a circuit configured to determine a phase offset of the rerouted data relative to a timing signal of the memory controller.

17. The memory controller of claim 12, wherein prior to the receiving of rerouted data, the memory controller is configured to determine a phase delay associated with transmission of rerouted data over the data bus to calibrate a timing parameter of the data bus.

18. A memory device for use in a system including a memory controller, a request bus coupling the memory controller and the memory device, and a data bus coupling the memory controller and the memory device, the memory device comprising:
- a data bus output buffer;
- circuitry configured to selectively reroute data received from the memory controller over the request bus to the data bus output buffer as rerouted data; and
- a timing circuit configured to time outputs from the data bus output buffer to the memory controller.

19. The memory device of claim 18, further comprising a circuitry to receive commands sent by the memory controller over the side band bus to the memory device, the commands instructing the memory device to selective reroute the data received from the memory controller over the request bus to the data bus output buffer as rerouted data and to transmit the rerouted data over the data bus to the memory controller.

* * * * *